US008272360B2

(12) United States Patent
Hartmann et al.

(10) Patent No.: US 8,272,360 B2
(45) Date of Patent: Sep. 25, 2012

(54) MOTOR VEHICLE ENERGY MANAGEMENT HAVING A SUPPLEMENTARY STARTER DIAGNOSTIC FUNCTION

(75) Inventors: Sven Hartmann, Stuttgart (DE); Marc Knapp, Erdmannhausen (DE)

(73) Assignee: Robert Bosch GmbH, Stuttgart (DE)

( * ) Notice: Subject to any disclaimer, the term of this patent is extended or adjusted under 35 U.S.C. 154(b) by 1001 days.

(21) Appl. No.: 11/631,041

(22) PCT Filed: May 10, 2005

(86) PCT No.: PCT/EP2005/052093
§ 371 (c)(1), (2), (4) Date: May 7, 2009

(87) PCT Pub. No.: WO2006/000496
PCT Pub. Date: Jan. 5, 2006

(65) Prior Publication Data
US 2009/0217897 A1 Sep. 3, 2009

(30) Foreign Application Priority Data
Jun. 29, 2004 (DE) ......................... 10 2004 031 306

(51) Int. Cl.
*G01R 31/36* (2006.01)
*G01R 31/34* (2006.01)
*F02N 17/00* (2006.01)

(52) U.S. Cl. ..... 123/179.3; 702/63; 702/64; 123/198 D; 73/114.59

(58) Field of Classification Search .............. 123/198 D; 73/114.59; 320/104; 702/63, 64; 701/102, 701/113
See application file for complete search history.

(56) References Cited

U.S. PATENT DOCUMENTS

| | | | | |
|---|---|---|---|---|
| 5,512,883 | A * | 4/1996 | Lane, Jr. | 340/648 |
| 6,148,781 | A * | 11/2000 | Boegner et al. | 290/38 R |
| 6,331,762 | B1 * | 12/2001 | Bertness | 320/134 |
| 7,312,968 | B2 * | 12/2007 | Kahara et al. | 361/93.1 |
| 7,774,110 | B2 * | 8/2010 | Sago | 701/29 |
| 7,791,310 | B2 * | 9/2010 | Luz et al. | 320/104 |
| 2001/0038274 | A1 * | 11/2001 | Peter | 320/104 |
| 2004/0124870 | A1 * | 7/2004 | Raichle | 324/772 |

FOREIGN PATENT DOCUMENTS

| | | |
|---|---|---|
| DE | 41 32 533 | 4/1993 |
| DE | 43 26 527 | 2/1995 |
| DE | 198 10 954 | 9/1999 |
| DE | 199 58 098 | 6/2001 |
| DE | 103 46 857 | 5/2005 |
| EP | 1 103 427 | 5/2001 |

OTHER PUBLICATIONS

Patent Abstracts of Japan, vol. 004, No. 171, Nov. 26, 1980 & JP 55 123358, Sep. 22, 1980 (abstract).

* cited by examiner

*Primary Examiner* — Stephen K Cronin
*Assistant Examiner* — Arnold Castro
(74) *Attorney, Agent, or Firm* — Kenyon & Kenyon LLP

(57) ABSTRACT

A diagnostic device for the starter of a combustion engine is provided. The electrical system of a motor vehicle includes a battery in whose connecting line a battery disconnect switch is provided, and the electrical system of the motor vehicle is monitored by a vehicle electrical system state detection device which includes starter diagnostic functionality.

17 Claims, 3 Drawing Sheets

MOTOR VEHICLE ENERGY MANAGEMENT HAVING A SUPPLEMENTARY STARTER DIAGNOSTIC FUNCTION

FIELD OF THE INVENTION

The present invention relates to a diagnostic device for the starter of a combustion engine.

BACKGROUND INFORMATION

The starting of combustion engines, whether they have applied spark ignition, direct injection or self-ignition, depends on the availability of the starter. The performance of the starter is a function of the size of the vehicle's battery, among other things. The thermal stress of the parts having current flowing through them, and the mechanical load of the parts transmitting the torque, increase with growing battery size. Although the starter is provided for only brief operating periods, one has to expect long cranking times of the combustion engines, especially at lower outside temperatures, and with that, a high thermal stress of the starter.

A starting device for internal combustion engines is described in published German patent document DE 198 10 954. The starting device for internal combustion engines includes a starter motor whose starter pinion is initially engaged with the ring gear of the internal combustion engine via a starter solenoid. After that, the starter motor is operated at maximum torque. Initially, the starter motor drives the pinion at reduced torque via a series resistor. At the same time, the starter solenoid for the starter pinion is pre-engaged at reduced engaging force, e.g., in a clocked manner, with the ring gear and engaged with it when this is indicated. After that, full power is supplied to the starter solenoid, so that the pinion is fully pressed into the ring gear and at the same time a switching contact of a relay, e.g., of the starter solenoid, bridges the series resistor of the starter motor. Now the starter motor is able to crank through the internal combustion engine at full torque.

Published German patent document DE 103 46 857 relates to a device for the protection of a starter line or a starter and generator line in a motor vehicle. The device includes a starter battery, a starter and a starter and generator line or a starter line connecting the starter to the starter battery, a battery disconnect switch being provided in the starter and generator line to which a switch control signal is supplied by a control and regulating unit. The control and regulating unit determines a switch control signal that opens the battery disconnect switch by the evaluation of the measured battery current. In the control and regulating unit, the evaluation of the measured battery current is undertaken while taking into consideration a stored protection characteristics line for the battery current. The stored protection characteristics line includes information about the response of further protection elements of the electrical system of a motor vehicle.

Battery state detection devices are known, within the scope of a motor vehicle electrical system monitoring, in which a metrological recording of electrical quantities and temperatures takes place, using subsequent evaluation by appropriate algorithms for the battery state detection device. Conventional starters of combustion engines are generally designed as DC motors, which are interconnected to the battery via a relay.

SUMMARY

Using the software integration proposed according to the present invention for a supplementary starter detection in an engine control unit that is already present, or in a vehicle electrical system state detection device, a sensor system that is already assigned to a motor vehicle battery may be utilized, on the one hand, and on the other hand, the functionality of the control unit that is already present or the vehicle electrical system state detection device that is present is able to be broadened to a considerable degree for a starter diagnosis. As a component subject to wear, the starter is very important with regard to starting reliability, and with that, with regard to the vehicle's availability. Instead of assigning the extended functionality to the starter, one may integrate the starter diagnosis directly into a vehicle electrical system state detection device, which makes it possible to utilize the components that are already present there for the starter diagnosis, so as to avoid a costly and thereby a cost-intensive redundancy.

Because of a starter diagnosis that is integrated into the vehicle electrical system state detection device or that is to be integrated into an engine control unit that is already present, the starter operation may be monitored at each application, and impending malfunctions, e.g., because of excessively long cranking phases, excessively great temperature stress or component wear, may be detected at an early time. Within the scope of currently usual fault storage readout measures within the framework of vehicle inspections, the data that are read out are able to be read out with respect to the mechanical wear of the starter components as well as its temperature stress, as seen over the operating time of the starter, and preventive maintenance measures may be undertaken on the starter of the combustion engine, so that one may guard against failure of this absolutely essential electrical component in vehicles for starting a combustion engine, in a far-sighted manner.

Within the starter diagnosis provided according to the present invention, the starting current of the starter is monitored as the meaningful input variable that can be derived from the battery current of the motor vehicle's battery. The voltage of the motor vehicle's battery may be used as additional information. In the vehicle electrical system state detection devices that are already used these days, the battery current during the starting procedure of a combustion engine is already ascertained at a resolution in the millisecond range, so that the corresponding information may also be drawn upon within the scope of a starter diagnosis.

DETAILED DESCRIPTION

Figure 1:
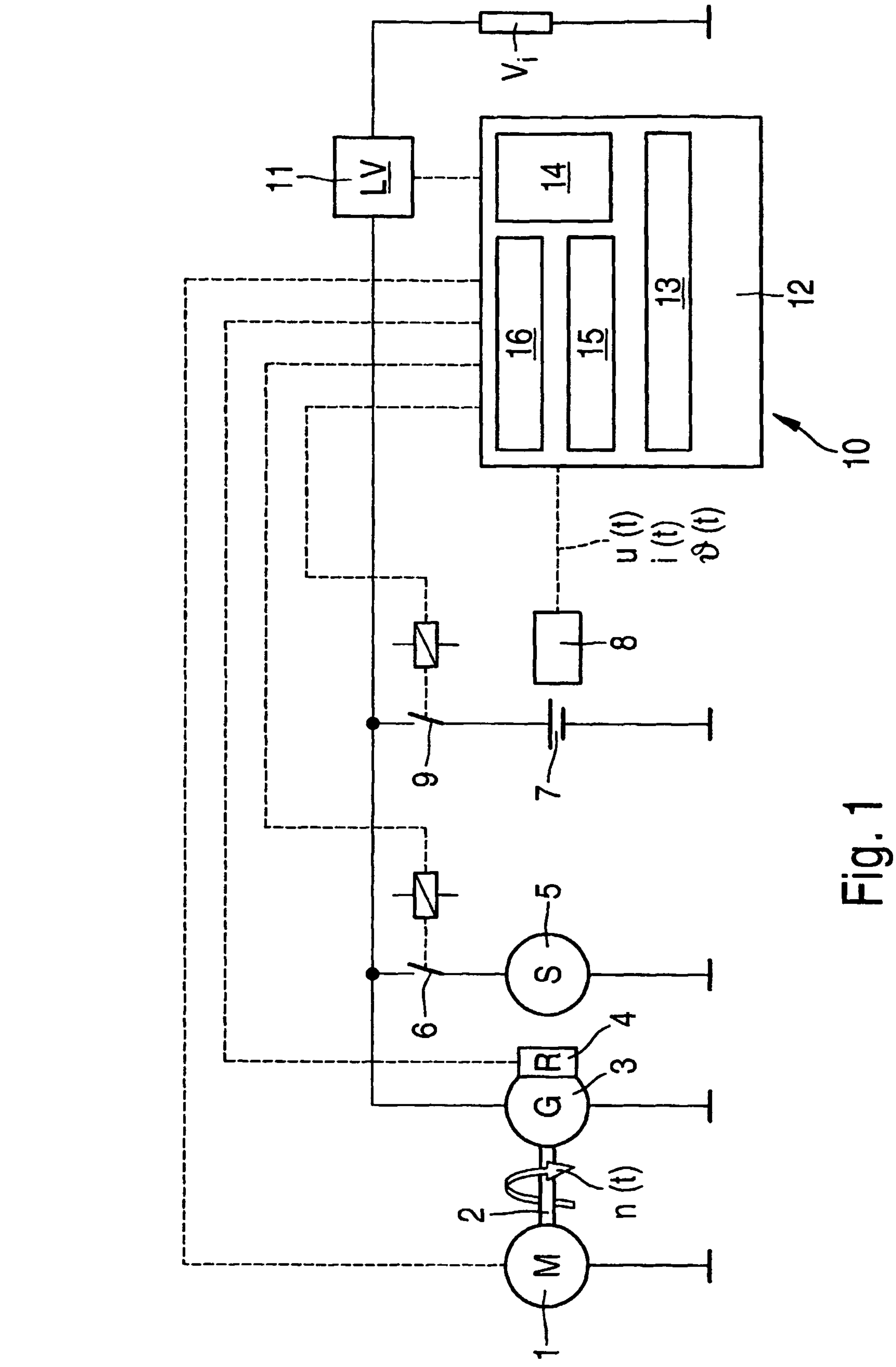
FIG. 1 shows the simplified equivalent circuit diagram including a generator, a starter, a motor vehicle battery as well as a schematically shown motor vehicle electrical system state detection device.

In the illustration shown FIG. 1, a simplified-equivalent circuit diagram may be seen of a generator, a starter, a motor vehicle's battery as well as a vehicle electrical system state detection device of a motor vehicle.

FIG. 1 shows a schematically illustrated combustion engine 1, which drives a generator 3 at a rotary speed 2 of n(t). Both combustion engine 1 and generator 3 and its generator controller 4 are connected via appropriate electrical connecting lines to a vehicle electrical system state detection device 10, which is only shown in schematic form in FIG. 1. Combustion engine 1, whether it has applied spark ignition or self-ignition, is cranked with the aid of a starter 5 during the starting process. A switch 6 is assigned to starter 5, whose position is detectable via a relay that is also in connection with vehicle electrical system state detection device 10. Furthermore, in the vehicle electrical system of the motor vehicle, there is a vehicle battery 7 that is able to be connected to starter 5 via a disconnect switch 9, provided its switch 6 is closed. In the case of a serious accident, battery disconnect switch 9 of vehicle battery 7 may be used, for instance, for switching off the battery if the relay contacts are stuck. The state of vehicle battery 7 is monitored using a battery sensor 8. Using this, for instance, battery voltage u(t), battery current i(t) and temperature θ(t), that is, the outside temperature, may be recorded and evaluated within the scope of a battery state detection device 16 in vehicle electrical system state detection device 10.

Reference numeral 11 designates a load distributor for the electric loads respectively present in the vehicle electrical system; $V_i$ symbolizes, in a representative way, a plurality of electrical users in the vehicle electrical system, such as windshield wiper motors, electrical window lifters, electrical seat adjustment drives and the like.

Vehicle electrical system state detection device 10 includes a plurality of hardware components identified by reference numeral 12 and software 13. In addition, an electrical energy management 14 is integrated into vehicle electrical system state detection device 10, which controls load distributor 11 with regard to a respective current maximum load of the vehicle electrical system of a motor vehicle. In vehicle electrical system state detection device 10 according to the illustration in FIG. 1, starter diagnosis 15 provided by the present invention is also implemented, which cooperates with a battery state detection device 16 that is also present in vehicle electrical system state detection device 10.

Figure 2:
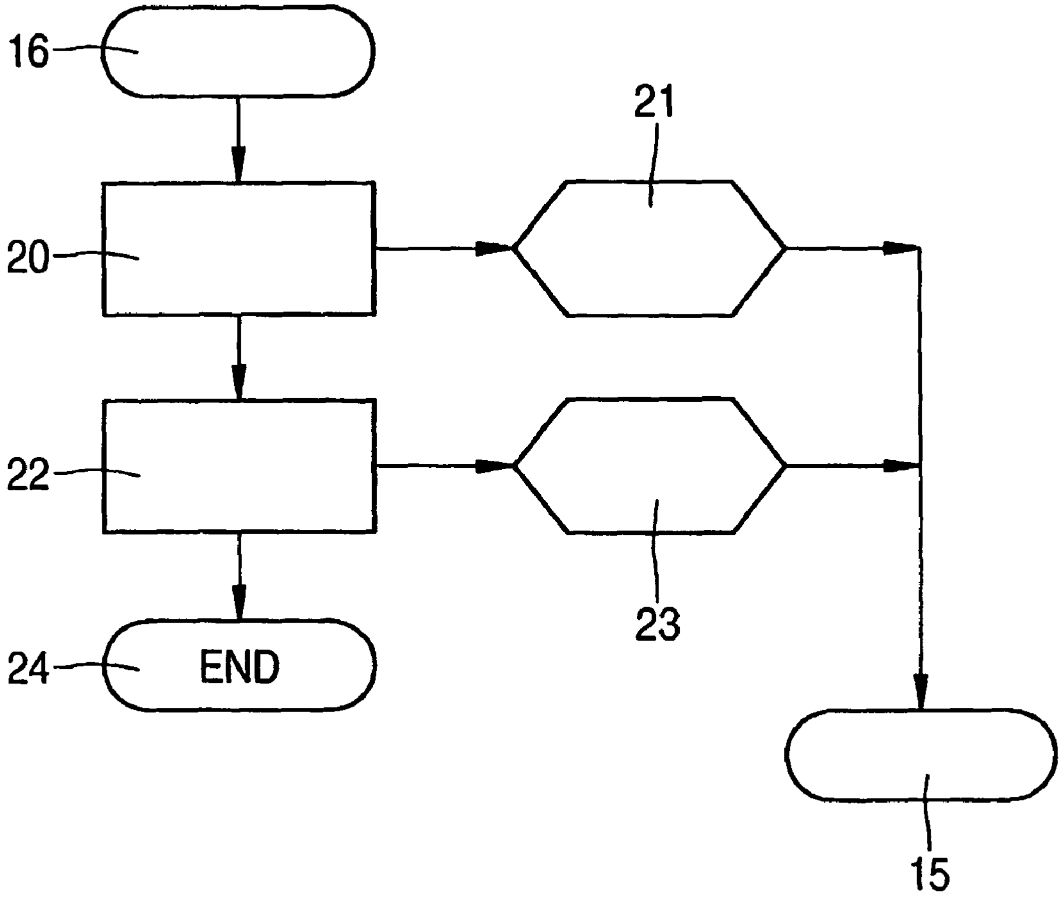
FIG. 2 shows a block diagram for a battery state detection device of a vehicle battery and the quantities ascertainable in it.

In the illustration according to FIG. 2, a block diagram of a battery state detection device may be seen schematically.

In battery state detection device 16, which may be part of a vehicle electrical system state detection device 10, the value of the respective current 21 deliverable by vehicle battery 7 is ascertained within a current/voltage measurement. Battery state detection device 16 moreover includes algorithms, with the aid of which battery voltage 23 can be ascertained from battery current 21. Both value 21 for the battery current and value 23 for the respective battery voltage may be supplied to a starter diagnosis 15, which is able to be implemented as an additional functionality within the scope of a vehicle electrical system state detection device 10.

Figure 3:
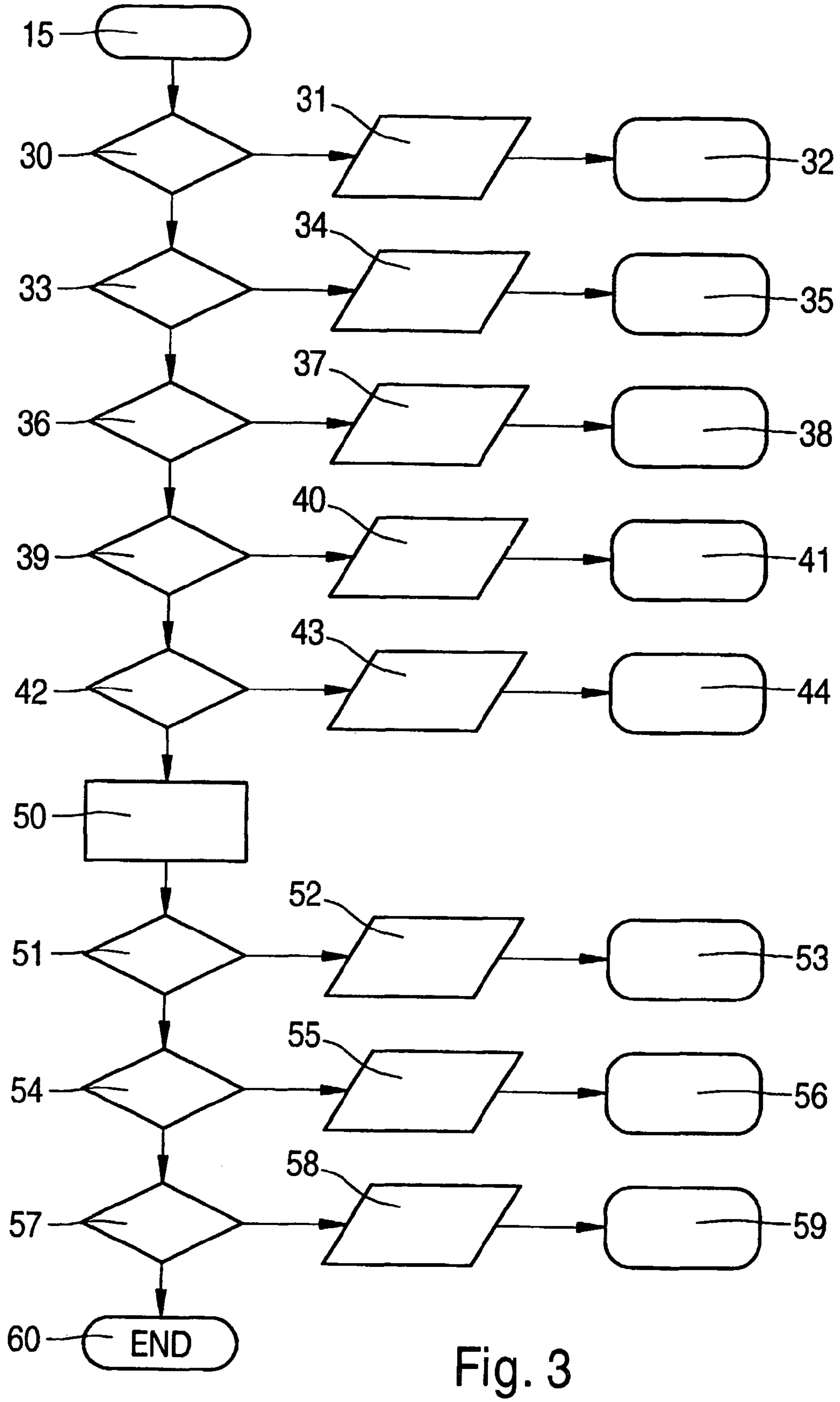
FIG. 3 shows a flowchart of the functionality of the starter diagnosis.

In the illustration according to FIG. 3, one may see in the form of a flow chart the steps which are able to be carried out within the starter diagnosis.

The individual steps shown in FIG. 3 are able to be run through in software 13 of vehicle electrical system state detection device 10. In a starting current comparison 30 for a first threshold value of the starting current, starter 5 is checked for the exceeding of a first starting current threshold value. If the specified first starting current threshold value (such as, for instance, 300 A) is not exceeded, a fault flag 31 is set, which points to the carrying out of a first measure 32, such as the maintenance of starter 5. However, switching off starter 5 may also be undertaken as first measure 32. This means that the relay is not able to close the main contact, and thereby cannot initiate the starting process. Possible causes for this are, for example, the occurrence of low voltage, too high a temperature in the relay or sluggishness within the engaging system of starter pinion and ring gear. Consequently, there is a danger of undesired overheating of the relay and possible damage as a result. For this reason, switching off starter 5 is performed and appropriate maintenance instructions are set.

An additional starting current comparison 33 for a second starting current threshold value (such as, for instance, approximately 1000 A) is post-connected to starting current comparison 30 for the first starting current threshold value of, for instance, 300 A. Within additional starting current comparison 33, the starting current of starter 5 is checked to see whether it exceeds a second threshold value, such as 1000 A. If this is detected to be so within the scope of the comparison carried out in additional starting current comparison 33, a corresponding fault flag 34 (battery too big, applied ignition start) is set, and the initiation of a second measure 35 is indicated. Second measure 35 may be constituted as switching off or making a maintenance recommendation. If starter 5 exceeds the second threshold value of, for instance, 1000 A, this may indicate that starter 5 is being operated using too great a voltage or batteries that are too big. There exists the danger of considerable consequential damage, for instance, by too great a starter rotary speed, for which starter 5 is not designed. Therefore, switching off starter 5 is appropriate. A reaction running in two stages is also possible, in which first a maintenance warning (check battery size) is set in response to the exceeding of a low threshold, for example, the named second threshold of 1000 A, and the switching off of the starter takes place in response to the exceeding of a higher threshold, such as 1200 A. In this case, starting the combustion engine using starter 5 is not possible.

Within the scope of starter diagnosis 15, a continuation is made from additional starting current comparison 33 to a frequency check of the starting current of starter 5. Within the scope of frequency check 36, the starting current of starter 5 is investigated to see whether it has high frequency components. In the positive case, a fault flag 37 is set, which points to the reaching of a wear boundary of starter 5. Powerful noise components in the frequency spectrum of starter 5, for example, point to excessive wear in the commutator system of starter 5.

A maintenance request (cf. reference numeral 38) may be set via a fault storage that can be read out during vehicle maintenance, and can be read out within the scope of an inspection by connecting a diagnostic plug of an engine control unit.

In a short circuit check 39 that is post-connected to frequency check 36 of the starting current of starter 5, the starting current of starter 5 is checked for the repeated occurrence of short circuit current peaks. In case those have occurred, a corresponding fault flag 40 (strongly low voltage in the vehicle electrical system of the motor vehicle or great overtemperature in the relay or even too high supply line resistances in the relay supply line or relay activation faults) is set. Repeated relay closing is taking place, which in the long run can lead to the occurrence of a short circuit; accordingly, switching off starter 5 is indicated for this fault case. The high currents occurring in response to short circuits go along with a high thermal stress of the components of starter 5. These are able to reduce the service life of starter 5 in a not inconsiderable manner; accordingly, the introduction of a fourth measure 41 is undertaken, i.e., switching off starter 5 or a maintenance recommendation is indicated.

In a checking step 42, that is post-connected to the short circuit check, for the current amplitude of the starting current of starter 5, the current amplitude of the starting current of starter 5 is determined. If it turns out within the scope of this check that the current amplitude of the starting current is decreasing, a fault flag 43 is set (misuse, fleeing vehicle driving). The starter current is checked whether it is constantly above a certain, fourth threshold value of, for instance, 500 A, which indicates that, for instance, starter 5 is being operated with a gear engaged. This takes place, for example, during improper use of the motor vehicle. As a rule, after a certain time, the starter has to be shut off as a function of the current level of the starter current, in order to avoid inadmissible overheating and thus an inadmissible thermal overstressing of the starter components. After the setting of corresponding fault flag 43, a shutting off is also undertaken or a maintenance recommendation 44 is output.

After running through the checking of the starting current of starter 5, within the scope of starting current comparison 30, of additional starting current comparison 33, of frequency check 36 of the starting current, of short circuit check 39 of the starting current, as well as of the checking of the current amplitude of the starting current of starter 5, if a start 50 of combustion engine 1 has taken place, the run-out current of starter 5 is checked. This takes place within the scope of a threshold value comparison 51 of the run-out current of starter 5 for falling below a third threshold value (for instance, 100 A).

If the third threshold value (for instance, 100 A) for the run-out current of starter 5 is exceeded, a fault flag 52 indicating sluggishness of the starter is set, which points to sluggishness of the mechanical components, such as, for instance, shafts that have run dry, defective bearings and additional faults, which are able to result in sluggishness of starter 5. In this case, a sixth measure 53 is recommended which is transmitted to vehicle electrical system state detection device 10 or an engine control unit of combustion engine 1, and which is able to be read out within the scope of an inspection of the motor vehicle by connecting the diagnostic plug from the engine control unit.

Threshold value comparison 51 for the run-out current of starter 5 is followed by an additional run-out current comparison 54 having a fourth threshold-value for the run-out current of starter 5. If the run-out current of starter 5 remains below the fourth threshold value of, for instance, 0 to 10 A, the system concludes that there is a freewheeling defect and a corresponding fault flag 55 is set. In this case, the conclusion is that there is a defect of the freewheeling situated between the starter shaft and the starter pinion. The carrying out of an appropriate seventh measure 56 is reported to vehicle electrical system state detection device 10, which is able to be read out within the scope of a following inspection of the motor vehicle. The garage personnel is given information-on an impending defect of starter 5, in the area of its freewheeling, by the setting of fault flag 55, so that they may intervene in a targeted manner.

The shutoff current (starter 5 in the switched off state) of starter 5 is investigated, within the scope of a shutoff current comparison 57, as to whether it exceeds a fifth threshold value (0 Ampere). In this case, a fault flag 58 may be set which points to sticking relay contacts. In this case, battery disconnect switch 9, that is reflected in the representation according to FIG. 1, can be activated in order to disconnect starter 5 from the vehicle electrical system of the motor vehicle. In the same way, the introduction of an eighth measure 59 may be recommended, which can be undertaken within the scope of a garage visit, for instance, during an inspection that is due, by reading out the engine control unit using a diagnostic plug. Reference numeral 60 designates the end of starter diagnosis 15. The implementation of starter diagnosis 15 within the scope of a vehicle electrical system state detection device 10 along with a battery state detection device 16 permits, in an advantageous manner, using the values for battery current 21 and battery voltage 23 calculated within battery state detection device 16 within the scope of starter diagnosis 15, so that battery sensor 8 assigned to a vehicle battery 7 can be utilized in multiple ways.

The threshold value checked within the scope of starting current comparison 30 is of an order of magnitude of 300 A, whereas the second threshold value of the starter current is selected, for instance, in a range of 1000 A. The third threshold value for the run-out current of starter 5 may be picked to be at 100 A, for example, while the fourth threshold value for the starter current may be fixed at a value between 0 A and 10 A. The fifth threshold value that is used for checking the shutoff current may be at 0 A, for example.

When we speak above of switching off starter 5, what is understood by this is the interruption of the starting process of the combustion engine. This is indicated when either no starting process is possible or when heavy damage is to be expected if the starting process is nevertheless carried out under the detected states that were described above in detail.

Within the scope of the starter functionality, one investigates both for sluggishness 52 of the mechanical components of starter 5 and for a fault in freewheeling, which is detected by fault flag 55 for "freewheeling defect". The results of the sluggishness indicated by fault flag 52 and the freewheeling defect indicated by fault flag 55 differ substantially from each other with regard to direction and effects. The direction and the action of the faults are opposite to each other, and accordingly they are recorded separately in the above-described starter functionality of the on-board diagnosis.

What is claimed is:

1. A device for diagnosing a starter of a combustion engine system, wherein the combustion engine system includes a vehicle battery and a battery disconnect switch provided in a connecting line of the vehicle battery, the device comprising:

a vehicle-electrical-system-state detection device that monitors a vehicle electrical system;

wherein:

the vehicle-electrical-system-state detection device includes a diagnostic functionality configured to diagnose the starter; and the diagnostic functionality checks a starting current of the starter for a presence of at least one of a high frequency, short-circuit current peaks, and a decreasing current amplitude, and, if at least one of the high frequency, the short-circuit current peaks, and the decreasing current amplitude is present, the diagnostic functionality sets at least one corresponding fault flag.

2. A device for diagnosing a starter of a combustion engine system, wherein the combustion engine system includes a vehicle battery and a battery disconnect switch provided in a connecting line of the vehicle battery, the device comprising:

a vehicle-electrical-system-state detection device that monitors a vehicle electrical system;

wherein:

the vehicle-electrical-system-state detection device includes a diagnostic functionality configured to diagnose the starter; and the diagnostic functionality checks a starting current of the starter for a presence of at least one of high-frequency components, short-circuit current peaks, and a decreasing current amplitude, and, if at least one of the high-frequency components, the short-circuit current peaks, and the decreasing current amplitude is present, the diagnostic functionality sets at least one corresponding fault flag.

3. The device as recited in claim 2, wherein:

the diagnostic functionality checks, after the start of the combustion engine, whether a run-out current of the starter at least one of: a) falls below a first predetermined threshold value; and b) exceeds a second predetermined threshold value;

if the run-out current of the starter falls below the first predetermined threshold value, the diagnostic functionality sets a first fault flag; and if the run-out current of the starter exceeds the second predetermined threshold value, the diagnostic functionality sets a second fault flag.

4. The device as recited in claim 3, wherein the diagnostic functionality checks whether a shut-off current of the starter falls below a third predetermined threshold value, and if the shut-off current of the starter falls below the third predetermined threshold value, the diagnostic functionality activates the battery disconnect switch.

5. The device as recited in claim 3, wherein the first fault flag indicates a sluggishness of the starter, and the second fault flag indicates a freewheeling defect at the starter.

6. The device as recited in claim 3, wherein the vehicle-electrical-system-state detection device includes a battery-state-detection device that ascertains values for a battery current and a battery voltage of the vehicle battery.

7. The device as recited in claim 3, wherein the diagnostic functionality is implemented by a computer program stored in the vehicle-electrical-system-state detection device.

8. The device as recited in claim 3, wherein the diagnostic functionality checks a starting current of the starter in at least one comparison operation that determines whether the starting current at least one of a) exceeds a first predetermined threshold value and b) falls below a second predetermined threshold value for the starting current of the starter.

9. The device as recited in claim 4, wherein the falling below the third predetermined threshold value by the shut-off current indicates a fault in relay contacts.

10. The devices as recited in claim 2, wherein:

the diagnostic functionality is adapted for checking whether a starting current of the starter exceeds a first predetermined threshold value for the starting current, and, if the starting current of the starter exceeds the first predetermined threshold value, the diagnostic functionality is adapted for responsively setting a first fault flag; and the diagnostic functionality is adapted for checking whether the starting current of the starter falls below a second predetermined threshold value for the starting current, and, if the starting current of the starter falls below the second predetermined threshold value, the diagnostic functionality is adapted for responsively setting a second fault flag.

11. The device as recited in claim 10, wherein the vehicle-electrical-system-state detection device includes a battery-state-detection device, and wherein the battery-state-detection device ascertains values for a battery current and a battery voltage of the vehicle battery.

12. The device as recited in claim 10, wherein the diagnostic functionality is implemented by a computer program stored in the vehicle-electrical-system-state detection device.

13. The device as recited in claim 10, wherein the first fault flag indicates a malfunction of a starter relay, and the second fault flag indicates a battery having too great a capacity in the case of applied spark ignition.

14. The device as recited in claim 2, wherein the diagnostic functionality checks a starting current of the starter in at least one comparison operation that determines whether the starting current at least one of a) exceeds a first predetermined threshold value and b) falls below a second predetermined threshold value for the starting current of the starter.

15. The device as recited in claim 2, wherein:

a fault flag set in response to the presence of the high-frequency components indicates a reaching of a wear-boundary of the starter;

a fault flag set in response to the presence of short-circuit current peaks indicates one of a low voltage and an over-temperature at the starter; and a fault flag set in response to the presence of the decreasing current amplitude indicates a misuse of the vehicle.

16. The device as recited in claim 2, wherein the vehicle-electrical-system-state detection device includes a battery-state-detection device that ascertains values for a battery current and a battery voltage of the vehicle battery.

17. The device as recited in claim 2, wherein the diagnostic functionality is implemented by a computer program stored in the vehicle-electrical-system-state detection device.

* * * * *